(12) United States Patent
Yokoi et al.

(10) Patent No.: US 9,690,156 B2
(45) Date of Patent: Jun. 27, 2017

(54) ACTIVE MATRIX SUBSTRATE AND DISPLAY DEVICE

(71) Applicant: Sharp Kabushiki Kaisha, Osaka-shi, Osaka (JP)

(72) Inventors: Yasuhiro Yokoi, Osaka (JP); Mitsunori Harada, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 14/776,925

(22) PCT Filed: Feb. 25, 2014

(86) PCT No.: PCT/JP2014/054507
§ 371 (c)(1),
(2) Date: Sep. 15, 2015

(87) PCT Pub. No.: WO2014/156434
PCT Pub. Date: Oct. 2, 2014

(65) Prior Publication Data
US 2016/0041444 A1    Feb. 11, 2016

(30) Foreign Application Priority Data

Mar. 29, 2013    (JP) .................. 2013-072047

(51) Int. Cl.
*H01L 29/22*    (2006.01)
*G02F 1/1362*    (2006.01)
(Continued)

(52) U.S. Cl.
CPC .... *G02F 1/136286* (2013.01); *G02F 1/13458* (2013.01); *H01L 27/124* (2013.01);
(Continued)

(58) Field of Classification Search
CPC .............. H01L 27/124; H01L 27/1248; H01L 27/3244; H01L 27/3258; G02F 1/133345; G02F 1/136286
(Continued)

(56) References Cited

U.S. PATENT DOCUMENTS

2007/0298538 A1    12/2007    Tanabe et al.
2010/0052147 A1    3/2010    Grillberger et al.
(Continued)

FOREIGN PATENT DOCUMENTS

CN    102132406 A    7/2011
CN    102217070 A    10/2011
(Continued)

*Primary Examiner* — Matthew E Warren
(74) *Attorney, Agent, or Firm* — Keating & Bennett, LLP

(57) ABSTRACT

An active matrix substrate includes: a first inorganic insulating film (first insulating layer) provided on a gate insulating film (insulating film); an organic insulating film (second insulating layer) provided on the first inorganic insulating film and having a thermal expansion coefficient different from that of the first inorganic insulating film; and a second inorganic insulating film (third insulating layer) provided in such a manner as to cover the organic insulating film and partially contacting the first inorganic insulating film. A notch is provided above the gate insulating film and in a portion of the second inorganic insulating film where the organic insulating film is not present.

9 Claims, 10 Drawing Sheets

(51) Int. Cl.
    *H01L 27/12*     (2006.01)
    *H01L 27/32*     (2006.01)
    *G02F 1/1345*     (2006.01)
    *G02F 1/1333*     (2006.01)

(52) U.S. Cl.
    CPC ...... *H01L 27/1248* (2013.01); *H01L 27/3258* (2013.01); *G02F 1/133345* (2013.01); *G02F 2203/60* (2013.01)

(58) Field of Classification Search
    USPC .................. 257/88, 93, 99; 349/138, 139
    See application file for complete search history.

(56) References Cited

U.S. PATENT DOCUMENTS

| | | |
|---|---|---|
| 2011/0220917 A1 | 9/2011 | Hayashi et al. |
| 2012/0235713 A1 | 9/2012 | Mori |
| 2014/0014979 A1* | 1/2014 | Matsumoto ......... H01L 33/0041 257/88 |

FOREIGN PATENT DOCUMENTS

| | | | | |
|---|---|---|---|---|
| CN | 102667897 A | 9/2012 | | |
| JP | 2007-328210 A | 12/2007 | | |
| KR | EP 2012175 A1 * | 1/2009 | ....... | G02F 1/133514 |

* cited by examiner

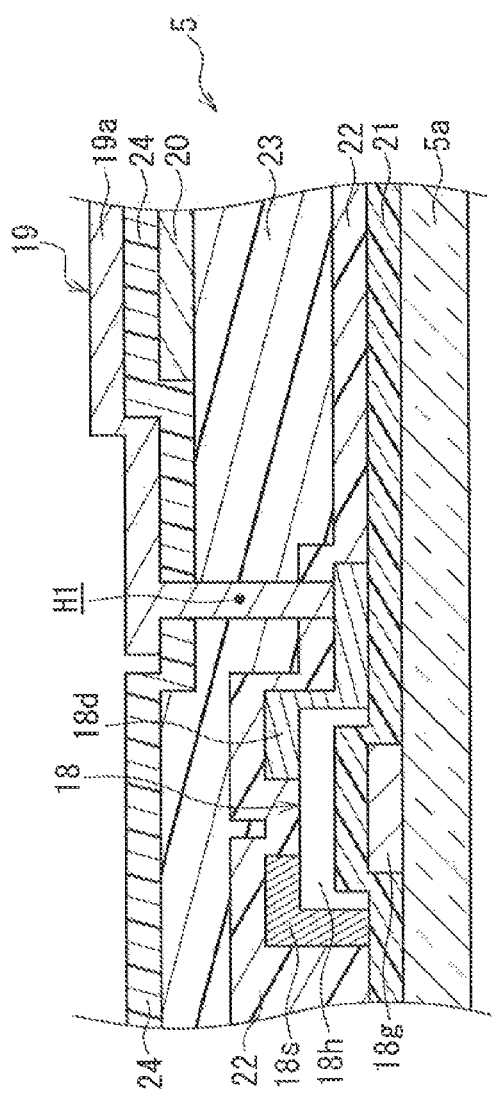
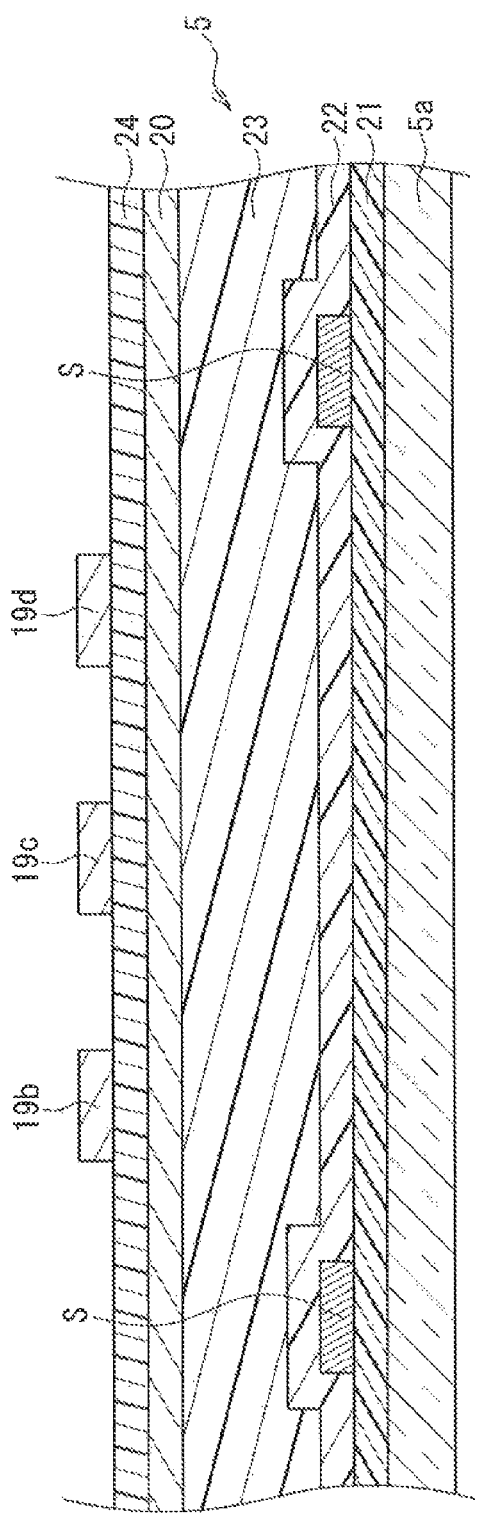
F I G. 4A
F I G. 4B

ACTIVE MATRIX SUBSTRATE AND DISPLAY DEVICE

TECHNICAL FIELD

The present invention relates to an active matrix substrate having gate bus lines and data bus lines, and a display device using the same.

BACKGROUND ART

Recently, for example, a liquid crystal display device has been used widely in a liquid crystal television, a monitor, a mobile phone, and the like as a flat panel display having features such as thinness and a light weight as compared with a conventional Broun tube. A known liquid crystal display device of this kind uses, in a liquid crystal panel as a display panel, an active matrix substrate in which a plurality of data bus lines (source lines) and a plurality of gate bus lines (scanning lines) are arranged in a matrix, and pixels, each having a switching element such as a TFT (Thin Film Transistor) and a pixel electrode connected to the switching element, are arranged in a matrix in the vicinities of intersections of the data bus lines and the gate bus lines.

Further, as described in Patent Document 1 below for example, it has been proposed that in a conventional active matrix substrate such as that described above, a second inorganic insulating film IN3 made of SiN is provided in such a manner as to cover an organic insulating film PAS, thereby increasing an auxiliary capacitance.

Specifically, in this conventional active matrix substrate, a gate insulating film GI covers the gate bus lines, and an interlayer insulating film IN1, a first inorganic insulating film IN2 made of SiN, and an organic insulating film PAS are provided on the gate insulating film GI in this order. A counter electrode (common electrode) CT and a reflection film RAL are provided on the organic insulating film PAS, and the second inorganic insulating film IN3 covers the organic insulating film PAS, the counter electrode (common electrode) CT and the reflection film RAL, and contacts the first inorganic insulating film IN2. Moreover, a pixel electrode PX is provided on the second inorganic insulating film IN3. The counter electrode CT, the second inorganic insulating film IN3, and the pixel electrode PX constitute an auxiliary capacitance. In this conventional active matrix substrate, as described above, it has been considered that an auxiliary capacitance can be increased by providing the second inorganic insulating film IN3 made of SiN.

PRIOR ART DOCUMENT

Patent Document

Patent Document 1: JP 2007-328210 A

DISCLOSURE OF INVENTION

Problem to be Solved by the Invention

However, in the conventional active matrix substrate as described above, since the second inorganic insulating film (third insulating layer) IN3 is configured to cover the organic insulating film (second insulating layer) PAS and contact the first inorganic insulating film (first insulating layer) IN2, abnormalities such as deformation and delamination in the second inorganic insulating film IN3 occurs at an interface (contact surface) between the first inorganic insulating film IN2 and the second inorganic insulating film IN3 due to a difference in thermal expansion coefficient between the first inorganic insulating film IN2 and the organic insulating film PAS.

In view of the above problem, it is an object of the present invention to provide an active matrix substrate that can avoid an abnormality in the third insulating layer at an interface with the first insulating layer due to a difference in thermal expansion coefficient between the first and second insulating layers, and a display device using the same.

Means for Solving Problem

To achieve the above object, an active matrix substrate according to the present invention is an active matrix substrate that includes: a base; a gate bus line provided on the base; and a data bus line provided in a layer different from that of the gate bus line with an insulating film interposed therebetween. The active matrix substrate further includes: a first insulating layer provided on the insulating film; a second insulating layer provided on the first insulating layer and having a thermal expansion coefficient different from that of the first insulating layer; and a third insulating layer provided in such a manner as to cover the second insulating layer and partially contacting the first insulating layer. At least part of a notch is provided above the insulating film and in a portion of the third insulating layer where the second insulating layer is not present.

In the active matrix substrate configured as above, at least part of a notch is provided above the insulating film and in a portion of the third insulating layer where the second insulating layer is not present. Thereby, unlike the above conventional example, it is possible to avoid an abnormality in the third insulating layer at an interface with the first insulating layer due to a difference in thermal expansion coefficient between the first and second insulating layers.

Further, preferably, the active matrix substrate further includes: a lead wire provided under the insulating film and connected to the gate bus line or the data bus line; and a first conductive layer provided on the insulating film at a position at least above the lead wire and exposed through the notch.

In this case, the first conductive layer can protect the lead wire. Thus, disconnection of the lead wire can be avoided reliably.

Further, in the above active matrix substrate, preferably, the first conductive layer is made from the same conductive layer as the data bus line.

In this case, it is possible to easily configure an active matrix substrate that has a simple structure and thus can be produced by a simplified production process.

Further, preferably, the above active matrix substrate further includes a second conductive layer provided on the first insulating layer at a position at least above the lead wire and exposed through the notch.

In this case, the second conductive layer can protect the lead wire. Thus, disconnection of the lead wire can be avoided reliably.

Further, in the above active matrix substrate, preferably, the notch is provided in such a manner as to expose an end portion of the second insulating layer.

In this case, it is possible to avoid an abnormality in the third insulating layer at an interface with the first insulating layer more reliably.

Further, in the above active matrix substrate, preferably, the second insulating layer is made of an organic insulating film.

In this case, it is possible to increase the thickness of the second insulating layer easily, and thus enhance insulation properties of the second insulating layer easily.

Further, in the above active matrix substrate, preferably, the first insulating layer, the second insulating layer, and the third insulating layer are made of an inorganic insulating film, an organic insulating film, and an inorganic insulating film, respectively.

In this case, it is possible to produce appropriate first to third insulating layers easily.

Further, in the above active matrix substrate, the first insulating layer and the third insulating layer may be made of the same insulating material.

In this case, it is possible to configure a low-cost active matrix substrate easily.

Further, in the above active matrix substrate, the notch may be provided in the vicinity of a connection terminal that is connected to the gate bus line or the data bus line.

In this case, the notch can avoid an abnormality in the third insulating layer even in the vicinity of a connection terminal where an abnormality in the third insulating layer occurs relatively easily.

Further, a display device of the present invention uses any one of the above active matrix substrates.

In the display device configured as above, since the active matrix substrate is used that can avoid an abnormality in the third insulating layer at an interface with the first insulating layer due to a difference in thermal expansion coefficient between the first and second insulating layers, it is possible to configure a highly-reliable display device easily.

Effect of the Invention

According to the present invention, it is possible to provide an active matrix substrate that can avoid an abnormality in the third insulating layer at an interface with the first insulating layer due to a difference in thermal expansion coefficient between the first and second insulating layers, and a display device using the same.

BRIEF DESCRIPTION OF DRAWINGS

FIG. 4A is a cross-sectional view taken along a line IVa-IVa in FIG. 3, and FIG. 4B is a cross-sectional view taken along a line IVb-IVb in FIG. 3.

DESCRIPTION OF THE INVENTION

Figure 1:
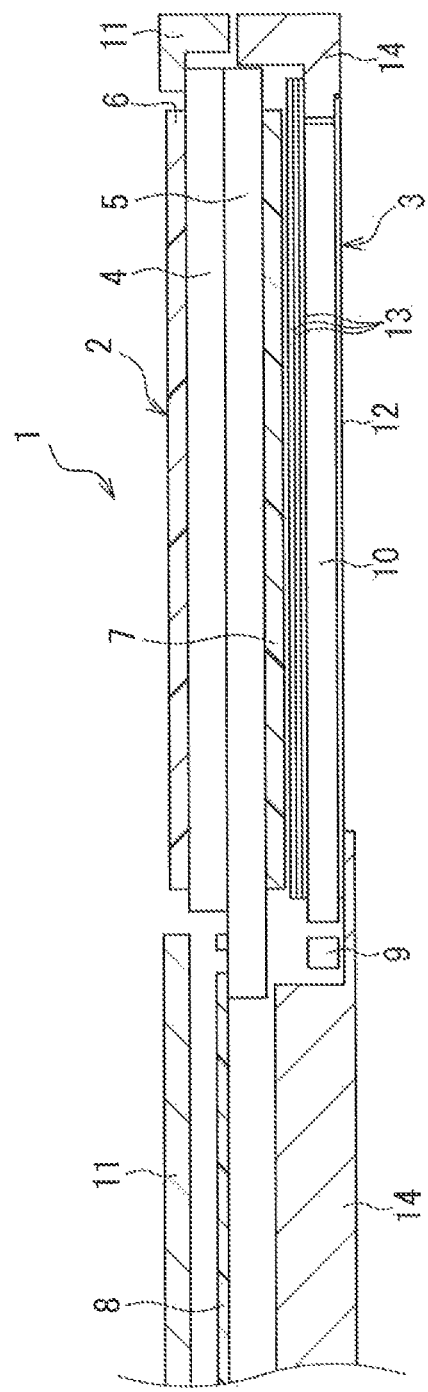
FIG. 1 is a view illustrating a liquid crystal display device in which an active matrix substrate according to Embodiment 1 of the present invention is used.

Hereinafter, preferred embodiments of an active matrix substrate and a display device of the present invention will be described with reference to the drawings. In the following description, the present invention is applied to a transmission-type liquid crystal display device. The dimensions of constituent members in the drawings do not faithfully reflect the actual dimensions of constituent members, dimension ratio of the respective constituent members, etc.

Embodiment 1

FIG. 1 is a view illustrating a liquid crystal display device in which an active matrix substrate according to Embodiment 1 of the present invention is used. In FIG. 1, a liquid crystal display device 1 of this embodiment is provided with a liquid crystal panel 2 and a backlight device 3. An upper side of the liquid crystal panel 2 in FIG. 1 is defined as a viewing side (display surface side). The backlight device 3 is arranged on a non-display surface side (lower side in FIG. 1) of the liquid crystal panel 2 and generates illumination light for illuminating the liquid crystal panel 2.

The liquid crystal panel 2 includes a counter substrate 4 and an active matrix substrate 5 of the present invention that constitute a pair of substrates, and polarizing plates 6, 7 that are provided on the outer surfaces of the counter substrate 4 and the active matrix substrate 5, respectively. A liquid crystal layer (described later) is sandwiched between the counter substrate 4 and the active matrix substrate 5. The counter substrate 4 and the active matrix substrate 5 are made of a flat plate-shaped transparent glass material or a transparent synthetic resin such as an acrylic resin. The polarizing plates 6, 7 are made of a resin film such as TAC (triacetyl cellulose) or PVA (polyvinyl alcohol). The polarizing plates 6, 7 are bonded to the corresponding counter substrate 4 or active matrix substrate 5 so as to cover at least an effective display region of a display surface of the liquid crystal panel 2. A λ/4 phase-contrast plate (quarter wavelength plate) sometimes is arranged between the polarizing plates 6, 7 and the liquid crystal layer.

The active matrix substrate 5 constitutes one of the pair of substrates and includes pixel electrodes, TFTs (Thin Film Transistor), a common electrode, etc., that are formed between the active matrix substrate 5 and the liquid crystal layer in accordance with a plurality of pixels included in the display surface of the liquid crystal panel 2 (detailed later). Meanwhile, the counter substrate 4 constitutes the other of the pair of substrates (counter substrate) and includes color filters, etc., that are formed between the counter substrate 4 and the liquid crystal layer (not shown).

The liquid crystal panel 2 is provided with a FPC (Flexible Printed Circuit) 8 that is connected to a control device (not shown) that performs drive control of the liquid crystal panel 2. The display surface is driven on a pixel basis by operating the liquid crystal layer on a pixel basis, whereby a desired image can be displayed on the display surface.

The liquid crystal panel 2 can have any liquid crystal mode and any pixel structure. The liquid crystal panel 2 also can have any drive mode. In other words, any liquid crystal panel capable of displaying information can be used as the liquid crystal panel 2. Therefore, a detailed structure of the liquid crystal panel 2 is not illustrated in FIG. 1, and a description thereof is omitted.

The backlight device 3 includes a light-emitting diode 9 as a light source, and a light-guiding plate 10 that is arranged so as to be opposed to the light-emitting diode 9. Further, in the backlight device 3, the light-emitting diode 9 and the light-guiding plate 10 are sandwiched by a bezel 14 having an L-shape in cross section, with the liquid crystal panel 2 being located above the light-guiding plate 10. Further, a case 11 is mounted on the counter substrate 4. Thus, the backlight device 3 is attached to the liquid crystal panel 2, and they are integrated as the transmission-type liquid crystal display device 1 in which illumination light from the backlight device 3 enters the liquid crystal panel 2.

The light-guiding plate 10 is made of, e.g., a synthetic resin such as a transparent acrylic resin, and receives light from the light-emitting diode 9. A reflecting sheet 12 is disposed on a surface of the light-guiding plate 10 on a side opposite the liquid crystal panel 2 side (opposed surface side). Further, optical sheets 13 such as a lens sheet and a diffusion sheet are provided on a surface of the light-guiding plate 10 on the liquid crystal panel 2 side (light-emitting surface side). Light from the light-emitting diode 9 that is guided in a predetermined light-guiding direction (from left to right in FIG. 1) into the light-guiding plate 10 is transformed into planar illumination light with uniform brightness and supplied to the liquid crystal panel 2.

In the above description, the edge-light type backlight device 3 having the light-guiding plate 10 is used. However, this embodiment is not limited to this, and a direct type backlight device may be used. Further, a backlight device having a light source other than light-emitting diodes such as cold cathode fluorescent tubes and hot cathode fluorescent tubes also may be used.

Next, the liquid crystal panel 2 of this embodiment will be described specifically with reference to FIG. 2.

Figure 2:
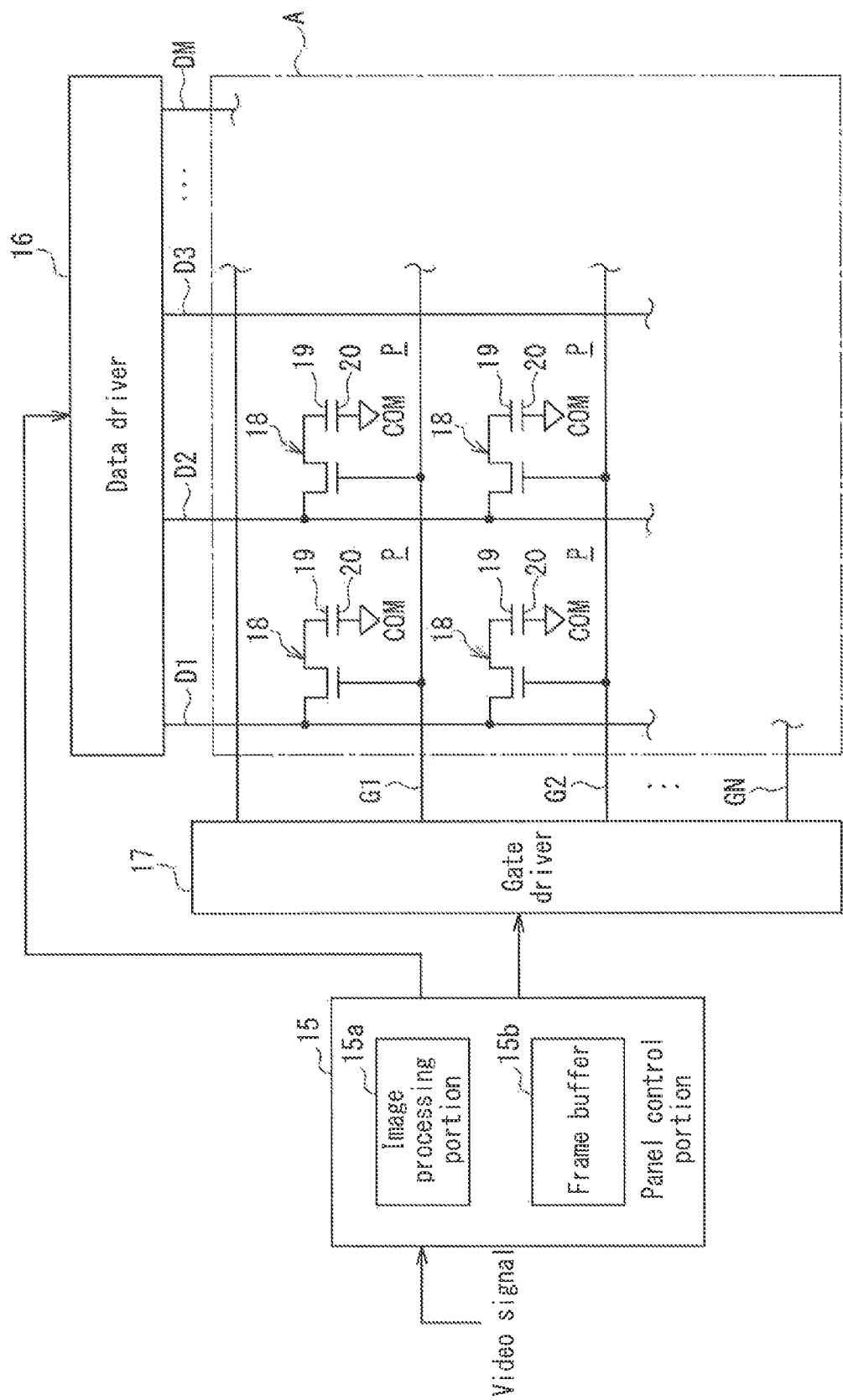
FIG. 2 is a diagram illustrating a configuration of a liquid crystal panel shown in FIG. 1.

FIG. 2 is a diagram illustrating a configuration of the liquid crystal panel shown in FIG. 1.

In FIG. 2, the liquid crystal display device 1 (FIG. 1) is provided with a panel control portion 15 that performs drive control of the liquid crystal panel 2 (FIG. 1) as the display portion that displays information such as characters and images, and a data driver (source driver) 16 and a gate driver 17 that are operated based on instruction signals from the panel control portion 15.

The panel control portion 15 is provided in the control device and receives video signals from the outside of the liquid crystal display device 1. The panel control portion 15 includes an image processing portion 15*a* that performs predetermined image processing on input video signals so as to generate instruction signals for the data driver 16 and the gate driver 17, and a frame buffer 15*b* that can store one frame of display data contained in input video signals. The panel control portion 15 performs drive control of the data driver 16 and the gate driver 17 in accordance with the input video signals, whereby information in accordance with the video signals is displayed on the liquid crystal panel 2.

The data driver 16 and the gate driver 17 are disposed on the active matrix substrate 5. Specifically, on a surface of the active matrix substrate 5, the data driver 16 is disposed along the transverse direction of the liquid crystal panel 2 in an outside region of an effective display region A of the liquid crystal panel 2 as a display panel. Further, the gate driver 17 is disposed along the longitudinal direction of the liquid crystal panel 2 in the outside region of the effective display region A on the surface of the active matrix substrate 5. Further, as described later, the data driver 16 and the gate driver 17 are mounted to terminal portions on the active matrix substrate 5, each terminal portion including a plurality of connection terminals.

Further, the data driver 16 and the gate driver 17 are drive circuits that drive, on a pixel basis, a plurality of pixels P provided on the liquid crystal panel 2 side. The data driver 16 and the gate driver 17 respectively are connected to a plurality of data bus lines (source lines) D1-DM (M is an integer of 2 or more; hereinafter, referred to as "D" collectively) and a plurality of gate bus lines (gate lines) G1-GN (N is an integer of 2 or more; hereinafter, referred to as "G" collectively). The data bus lines D and the gate bus lines G are arranged in a matrix so as to cross each other on a base (described later) made of a transparent glass material or a transparent synthetic resin that is contained in the active matrix substrate 5. In other words, the data bus lines D are provided on the base so as to be parallel to a column direction in the matrix (the longitudinal direction of the liquid crystal panel 2) and the gate bus lines G are provided on the base so as to be parallel to a row direction in the matrix (the transverse direction of the liquid crystal panel 2).

Further, in the vicinity of each intersection between the data bus lines D and the gate bus lines G, a pixel P, which has a thin film transistor 18 as a switching element and a pixel electrode 19 connected to the thin film transistor 18, is provided. Further, in each of the pixels P, a common electrode 20 is provided on the active matrix substrate 5 so as to be opposed to the pixel electrode 19.

Further, in the active matrix substrate 5, in the respective regions partitioned in a matrix by the data bus lines D and the gate bus lines G, a plurality of regions of pixels P are formed. The plurality of pixels P include red (R), green (G) and blue (B) pixels. The RGB pixels are arranged sequentially in parallel to the gate bus lines G1-GN in this order, for example. Further, the RGB pixels can display corresponding color by color filter layers provided on the counter substrate 4 side.

Further, in the active matrix substrate 5, the gate driver 17 sequentially outputs scanning signals (gate signals) with respect to the gate bus lines G1-GN so as to bring gate electrodes of the corresponding thin film transistors 18 to an ON state based on instruction signals from the image processing portion 15*a*. Further, the data driver 16 outputs data signals (voltage signals (gradation voltage)) in accordance with brightness (gradation) of the display image with respect to the corresponding data bus lines D1-DM, based on instruction signals from the image processing portion 15*a*.

Next, a specific configuration of the pixels P provided in the active matrix substrate 5 of this embodiment will be described with reference to FIGS. 3, 4A, and 4B.

Figure 3:
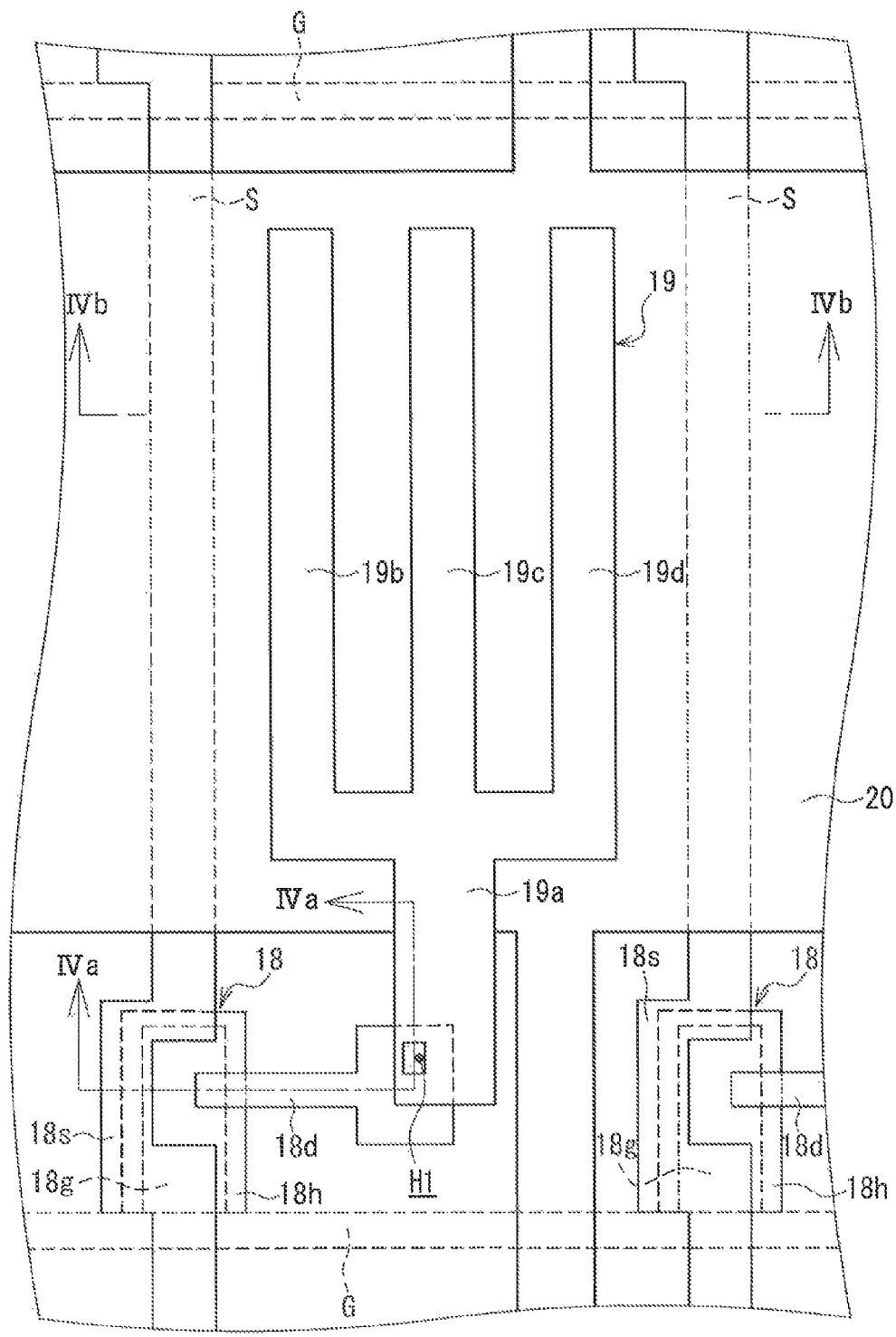
FIG. 3 is an enlarged plan view illustrating a pixel configuration of the liquid crystal panel.

FIG. 3 is an enlarged plan view illustrating a pixel configuration of the above liquid crystal panel. FIG. 4A is a cross-sectional view taken along a line IVa-IVa in FIG. 3, and FIG. 4B is a cross-sectional view taken along a line IVb-IVb in FIG. 3.

As shown in FIGS. 3, 4A, and 4B, in the active matrix substrate 5 of this embodiment, there are provided on a base 5*a* the gate bus lines G and gate electrodes 18*g* of the thin film transistors 18 that are formed integrally with the gate bus lines G. The gate bus lines G and the gate electrodes 18*g* are made of, e.g., a molybdenum film, an aluminum film, a titanium film, a tungsten film, a tantalum film, a copper film, or an alloy film thereof. Other than these, the gate bus lines G and the gate electrodes 18*g* may be made of, e.g., metal films having a plural structure in which a plurality of metal films are stacked one on top of another. Examples of such metal films include: metal films of a two-layered structure such as a copper film and a titanium film, a copper film and a molybdenum film, and a copper film and a molybdenum alloy film; and metal films of a three-layered structure such as an aluminum film, a titanium film and an aluminum film, and a molybdenum film, an aluminum film and a molybdenum film.

Further, a gate insulating film 21 is provided in such a manner as to cover the base 5*a*, the gate bus lines G, and the gate electrodes 18*g*. The gate insulating film 21 constitutes an insulating film, and can be, e.g., silicon nitride (SiNx) or a stacked film of silicon nitride (SiNx) and silicon oxide (SiO$_2$).

A semiconductor layer 18*h* of the thin film transistor 18 is formed on the gate insulating film 21. The semiconductor layer 18*h* is made of, e.g., an oxide semiconductor. A suitable example of the oxide semiconductor is an In—Ga—Zn—O based amorphous oxide semiconductor containing In, Ga, and Zn at a ratio of 1:1:1. However, the ratio of In, Ga, and Zn is not limited thereto, and it may be determined appropriately. Further, in place of the above In—Ga—Zn—O based amorphous oxide semiconductor film, other oxide semiconductor films may be used.

For example, the semiconductor layer 18*h* may be formed of an InGaO3(ZnO) film, magnesium zinc oxide (MgxZn1-xO), cadmium zinc oxide (CdxZn1-xO), cadmium oxide (CdO), or the like. Further, the semiconductor layer 18*h* may be formed of ZnO to which one or more kinds of impurity elements selected from group 1 elements, group 13 elements, group 14 elements, group 15 elements, and group 17 elements are added. However, it is unnecessary to add such impurity elements to ZnO. Further, ZnO may be an amorphous state, a polycrystalline state, or a microcrystalline state in which an amorphous state and a polycrystalline state are mixed.

An amorphous oxide semiconductor has advantages in that it can be produced at low temperatures and it achieves high mobility. However, in place of the amorphous oxide semiconductor, an oxide semiconductor having crystallinity may be used. A preferable example of the crystalline oxide semiconductor layer is a crystalline oxide semiconductor layer in which a c-axis is aligned substantially vertical to a layer surface. A thin-film transistor having such an oxide semiconductor layer is disclosed in JP 2012-134475 A, for example.

In addition to the above description, the semiconductor layer 18*h* may be configured using, e.g., amorphous silicon, polysilicon, or microcrystal silicon.

Further, on the gate insulating film 21, there are provided the data bus lines D, source electrodes 18*s* of the thin film transistors 18 that are formed integrally with the data bus lines D, and drain electrodes 18*d* of the thin film transistors 18. The data bus lines D, the source electrodes 18*s*, and the drain electrodes 18*d* are made of, e.g., a molybdenum film, an aluminum film, a titanium film, a tungsten film, a tantalum film, a copper film, or an alloy film thereof. Other than these, the data bus lines D, the source electrodes 18*s*, and the drain electrodes 18*d* may be made of, e.g., metal films having a plural structure in which a plurality of metal films are stacked one on top of another. Examples of such metal films include: metal films of a two-layered structure such as a copper film and a titanium film, a copper film and a molybdenum film, and a copper film and a molybdenum alloy film; and metal films of a three-layered structure such as an aluminum film, a titanium film and an aluminum film, and a molybdenum film, an aluminum film and a molybdenum film.

Further, a first inorganic insulating film 22 is provided on the gate insulating film 21 in such a manner as to cover the data bus lines D, the source electrodes 18*s*, the semiconductor layer 18*h*, and the drain electrodes 18*d*. The first inorganic insulating film 22 constitutes a first insulating layer, and functions as a protection film. Further, the first inorganic insulating film 22 is made of, e.g., silicon nitride (SiNx) or silicon oxide (SiO$_2$). Further, the first inorganic insulating film 22 is formed by, e.g., a CVD method or a sputtering method, and the film thickness is in a range of, e.g., 50 nm to 5000 nm.

Further, an organic insulating film 23 is provided on the first inorganic insulating film 22. The organic insulating film 23 constitutes a second insulating layer, and functions as a flattening film. Further, the organic insulating film 23 is made of, e.g., acrylic-based resin. Further, the organic insulating film 23 is formed by, e.g., a spin coat method, and the film thickness is in a range of, e.g., 1 μm to 5 μm. The organic insulating film 23 is not formed in the vicinity of a connection terminal of a terminal portion (detailed later).

The common electrode 20 is formed on the organic insulating film 23. As illustrated in FIG. 3, the common electrode 20 is shared by all of the pixels P, and configured to have a shape corresponding to an effective display region of each pixel P (i.e., an opening of each pixel P). Further, the common electrode 20 is made of, e.g., a transparent electrode material such as ITO and IZO.

A second inorganic insulating film 24 is provided in such a manner as to cover the organic insulating film 23 and the common electrode 20. The second inorganic insulating film 24 constitutes a third insulating layer, and functions as a protection film. Further, the second inorganic insulating film 24 is made of the same insulating material as that of the first inorganic insulating film 22, e.g., silicon nitride (SiNx) or silicon oxide (SiO$_2$). Further, the second inorganic insulating film 24 is formed by, e.g., a CVD method or a sputtering method, and the film thickness is in a range of, e.g., 50 nm to 5000 nm. In the vicinity of the connection terminal of the terminal portion, the second inorganic insulating film 24 partially contacts the first inorganic insulating film 22 (detailed later).

The pixel electrodes 19 are formed on the second inorganic insulating film 24. The pixel electrodes 19 are made of, e.g., a transparent electrode material such as ITO and IZO.

Further, as show in FIG. 4A, an opening is provided in the first inorganic insulating film 22, the organic insulating film 23, and the second inorganic insulating film 24, thereby forming a terminal contact hole H1 for connecting the drain electrode 18*d* and the pixel electrode 19.

The liquid crystal panel 2 of this embodiment is a so-called liquid crystal panel of a transverse electric field in which pixels P of a horizontal alignment mode are used, for example. Specifically, horizontal alignment films are provided on the inner surfaces of the active matrix substrate 5 and the counter substrate 4, and a liquid crystal layer composed of liquid crystals with positive dielectric anisotropy is provided between these horizontal alignment films.

Next, main portions of the active matrix substrate 5 of this embodiment will be described specifically with reference to FIGS. 5, 6A, and 6B.

Figure 5:
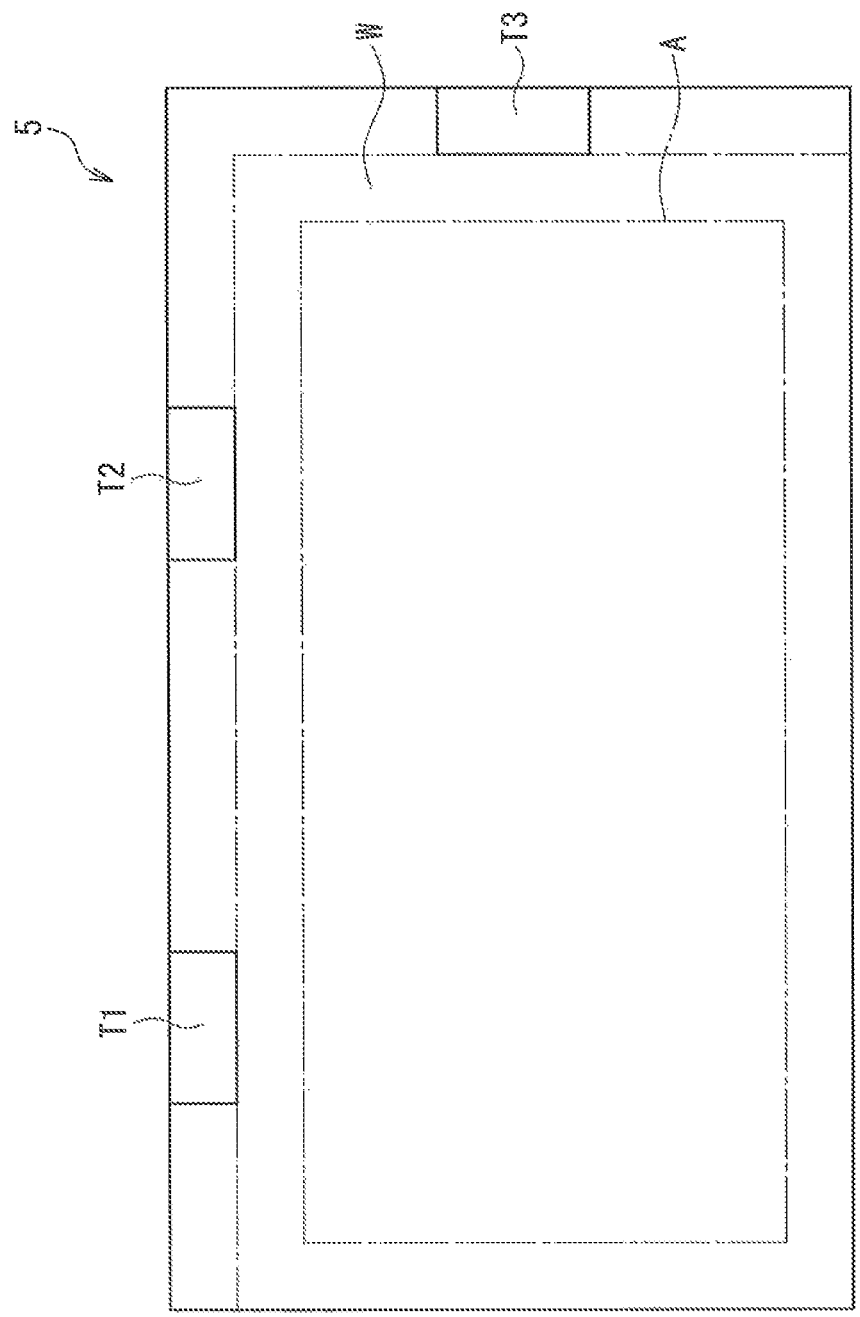
FIG. 5 is a view illustrating an installation example of terminal portions of the active matrix substrate.

FIG. 5 is a view illustrating an installation example of terminal portions of the above active matrix substrate. FIG. 6A is a plan view illustrating main portions of the above active matrix substrate, and FIG. 6B is a cross-sectional view taken along a line VIb-VIb in FIG. 6A.

As illustrated in FIG. 5, in the active matrix substrate 5 of this embodiment, a lead wire region W in which lead wires (described later) connected to the gate bus lines G or data bus lines D are arranged is provided outside the effective display region A. In a region outside the lead wire region W, three terminal portions T1, T2, and T3 each including connection terminals are provided.

Specifically, the active matrix substrate 5 of this embodiment includes, e.g., two terminal portions T1 and T2 that are provided along one side in a transverse direction of the active matrix substrate 5 as shown in FIG. 5. Two data drivers 16 are provided for the two terminal portions T1 and T2, respectively, so that terminals of the data drivers 16 are mounted to the corresponding connection terminals included in the respective terminal portions T1 and T2.

Further, the active matrix substrate 5 of this embodiment includes, e.g., one terminal portion T3 that is provided along one side in a longitudinal direction of the active matrix substrate 5 as shown in FIG. 5. One gate driver 17 is provided for the one terminal portion T3, so that a terminal of the gate driver 17 is mounted to the connection terminal included in the terminal portion T3.

In the lead wire region W, for connection with the corresponding data driver 16 or gate driver 17, the above lead wires are arranged at angles relative to an arrangement direction of the connected data bus lines D or gate bus lines G (not shown). Incidentally, in sides of the active matrix substrate 5 where the terminal portions T1-T3 are not provided (the lower side and the left side in FIG. 5), the lead wires are arranged in line with the connected data bus lines D or gate bus lines G.

Figure 6A:
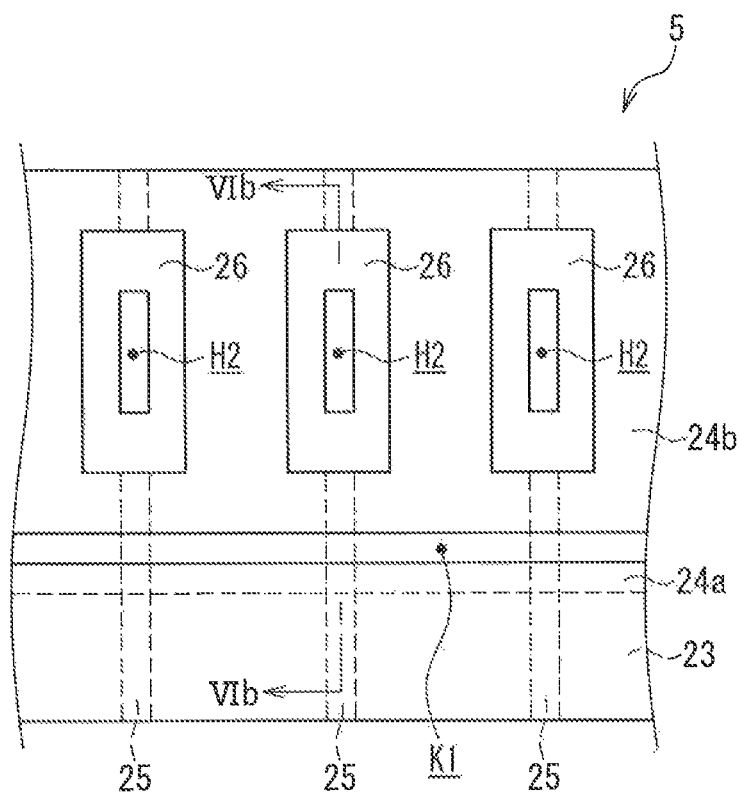
FIG. 6A is a plan view illustrating main portions of the active matrix substrate.
Figure 6B:
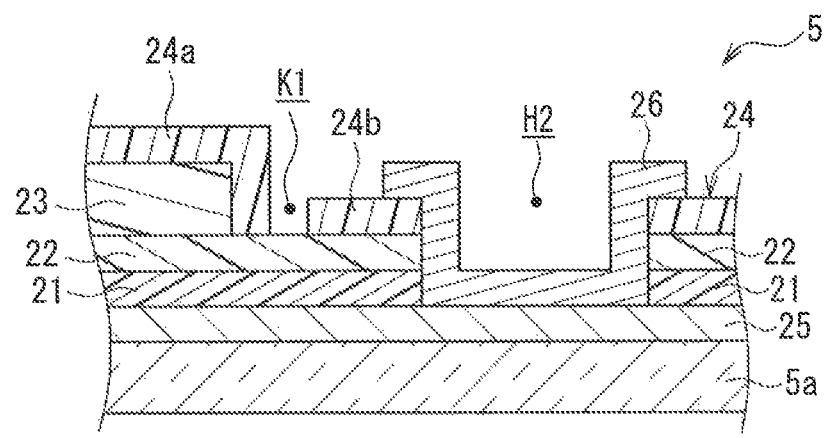
FIG. 6B is a cross-sectional view taken along a line VIb-VIb in FIG. 6A.

Further, as shown in FIGS. 6A and 6B, each of the terminal portions T1-T3 includes a plurality of connection terminals 26, to which lead wires 25 that are connected to the gate bus lines G or data bus lines D are connected.

Specifically, as shown in FIG. 6B, the lead wires 25 made from the same conductive layer as the gate bus lines G are formed on the base 5a, and the gate insulating film 21 and the first inorganic insulating film 22 are formed in such a manner as to cover the lead wires 25. That is, the lead wires 25 are provided under the gate insulating film 21.

Further, as shown in FIGS. 6A and 6B, the organic insulating film 23 is not formed in the vicinity of the connection terminals 26 so that the connection terminals 26 can be connected to the terminals of the data driver 16 or the terminals of the gate driver 17 reliably. That is, in the vicinity of an area where the terminal portions T1-T3 are provided, the organic insulating film 23 is not formed to the edge of the area, and the first and second inorganic insulating films 22 and 24 are in contact with each other as described below. On the other hand, in the sides of the active matrix substrate 5 where the terminal portions T1-T3 are not provided (the lower side and the left side in FIG. 5), the organic insulating film 23 is formed to the edge of the area (the first and second inorganic insulating films 22 and 24 are not in contact with each other).

In addition to the above description, also in the area where the terminal portions T1-T3 are not provided, the organic insulating film 23 may not be formed to the edge of the area (a configuration in which the first and second inorganic insulating films 22 and 24 are in contact with each other). In this case, also in the area where the terminal portions T1-T3 are not provided, it is preferable to form a notch (described later) in the same manner as in the area where the terminal portions T1-T3 are provided.

Further, as shown in FIGS. 6A and 6B, in the vicinity of the connection terminals 26, the second inorganic insulating film 24 partially contacts the first inorganic insulating film 22.

Further, as shown in FIG. 6B, an opening is provided in the gate insulating film 21, the first inorganic insulating film 22 and the second inorganic insulating film 24, thereby forming a terminal contact hole H2 for connecting the lead wire 25 and the connection terminal 26.

Further, in the active matrix substrate 5 of this embodiment, as shown in FIGS. 6A and 6B, a rectangular notch K1 is provided above the gate insulating film 21 and in a portion of the second inorganic insulating film 24 where the organic insulating film 23 is not present. That is, the notch K1 is provided partially in a portion of the second inorganic insulating film 24 that contacts the first inorganic insulating film 22. The notch K1 is formed continuously and parallel to one side of the active matrix substrate (the upper side or the right side in FIG. 5), thereby completely separating the second inorganic insulating film 24 into a portion 24a on the organic insulating film (second insulating layer) 23 side and a portion 24b on the connection terminal 26 side.

In the active matrix substrate 5 of this embodiment configured as described above, the notch K1 is provided above the gate insulating film (insulating film) 21 and in a portion of the second inorganic insulating film (third insulating layer) 24 where the organic insulating film (second insulating layer) 23 is not present. Thereby, in the active matrix substrate 5 of this embodiment, unlike the above conventional examples, it is possible to avoid an abnormality in the second inorganic insulating film 24 at an interface (contact surface) with the first inorganic insulating film 22 due to a difference in thermal expansion coefficient between the first inorganic insulating film 22 and the organic insulating film (second insulating layer) 23.

Figure 7A:
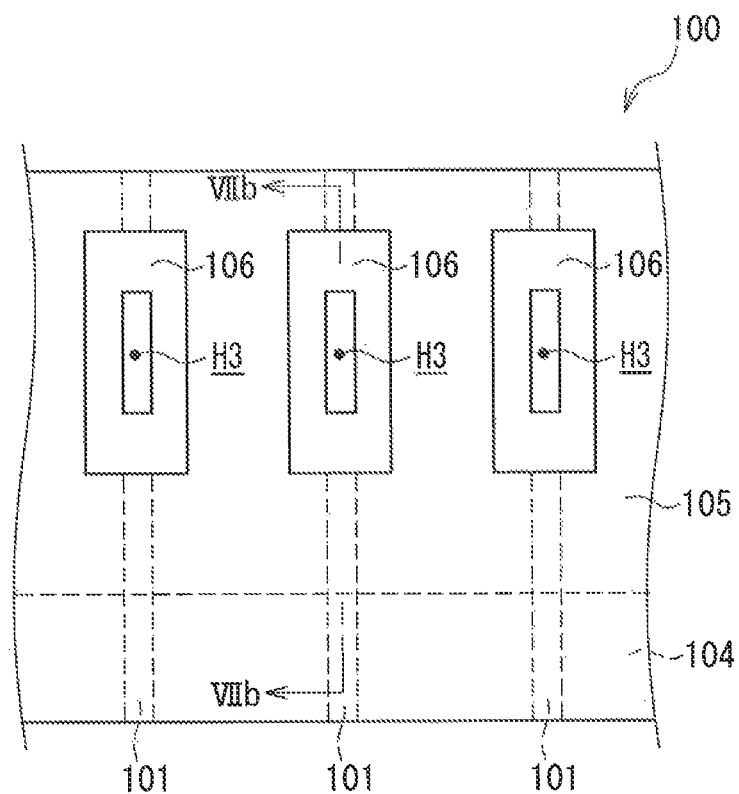
FIG. 7A is a plan view illustrating main portions of an active matrix substrate of a comparative example.
Figure 7B:
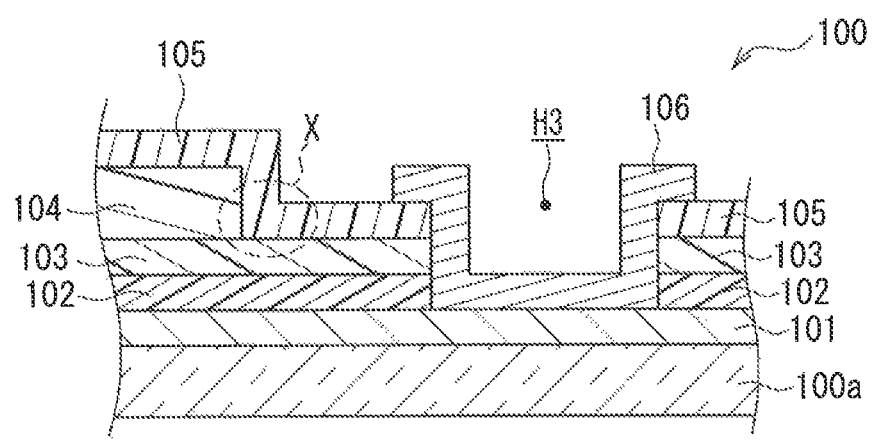
FIG. 7B is a cross-sectional view taken along a line VIIb-VIIb in FIG. 7A.

Here, effects of the notch K1 are described specifically with reference to FIGS. 7A and 7B.

FIG. 7A is a plan view illustrating main portions of an active matrix substrate of a comparative example, and FIG. 7B is a cross-sectional view taken along a line VIIb-VIIb in FIG. 7A.

As shown in FIGS. 7A and 7B, in an active matrix substrate 100 of the comparative example, lead wires 101, a gate insulating film 102, and a first inorganic insulating film 103 are provided on a base 100a in this order. An organic insulating film 104 is provided on the first inorganic insulating film 103, and a second inorganic insulating film 105 is provided in such a manner as to cover the organic insulating film 104 and contact the first inorganic insulating film 103 partially.

Further, as shown in FIG. 7B, an opening is provided in the gate insulating film 102, the first inorganic insulating film 103, and the second inorganic insulating film 105, thereby forming a terminal contact hole H3 for connecting the lead wire 101 and the connection terminal 106.

As shown in FIGS. 7A and 7B, in the active matrix substrate 100 of the comparative example, unlike the active matrix substrate 5 of this embodiment, a notch is not formed in the second inorganic insulating film 105. Because of this, in the active matrix substrate 100 of the comparative example, it is impossible to avoid adverse effects (occurrence of stress, etc.) of following change in the second inorganic insulating film 105 occurring due to a difference in thermal expansion coefficient between the first inorganic insulating film 103 and the organic insulating film 104. Consequently, in the active matrix substrate 100 of the comparative example, it is impossible to avoid abnormalities such as deformation and delamination in the second inorganic insulating film 105 due to a stress at a portion indicated by "X" in FIG. 7B, i.e., an interface (contact surface) between the first and second inorganic insulating films 103 and 105.

On the other hand, in the active matrix substrate 5 of this embodiment, the notch K1 is provided above the gate insulating film (insulating film) 21 and in a portion of the second inorganic insulating film (third insulating layer) 24 where the organic insulating film (second insulating layer) 23 is not present. Thus, the notch K1 can avoid adverse effects (occurrence of stress, etc.) of following change in the second inorganic insulating film 24 occurring due to a difference in thermal expansion coefficient between the first inorganic insulating film 22 and the organic insulating film 23, and avoid an abnormality in the second inorganic insulating film 24 at an interface (contact surface) between the first and second inorganic insulating films 22 and 24.

Further, in the active matrix substrate 5 of this embodiment, the second inorganic insulating film 24 covers the organic insulating film 23, thereby preventing swelling of the organic insulating film 23 due to moisture absorption. This consequently avoids an abnormality in the second inorganic insulating film 24 more reliably.

Further, in this embodiment, the notch K1 is provided in the vicinity of the connection terminals 26 that are connected to the gate bus lines G or data bus lines D. Thereby, in this embodiment, the notch K1 can avoid an abnormality in the second inorganic insulating film 24 even in the vicinity of the connection terminals 26 where an abnormality in the second inorganic insulating film 24 occurs relatively easily.

Incidentally, in the pixel configuration shown in FIGS. 4A and 4B, since there is no interface (contact surface) between the first and second inorganic insulating films 22 and 24, an abnormality in the second inorganic insulating film 24 due to a difference in thermal expansion coefficient between the first inorganic insulating film 22 and the organic insulating film 23 does not occur.

Further, in this embodiment, since the active matrix substrate 5 is used that is capable of avoiding an abnormality in the second inorganic insulating film 24 at an interface (contact surface) between the first and second inorganic insulating films 22 and 24 due to a difference in thermal expansion coefficient between the first inorganic insulating film 22 and the organic insulating film (second insulating layer) 23, it is possible to configure a highly-reliable liquid crystal display device (display device) 1 easily.

Embodiment 2

Figure 8A:
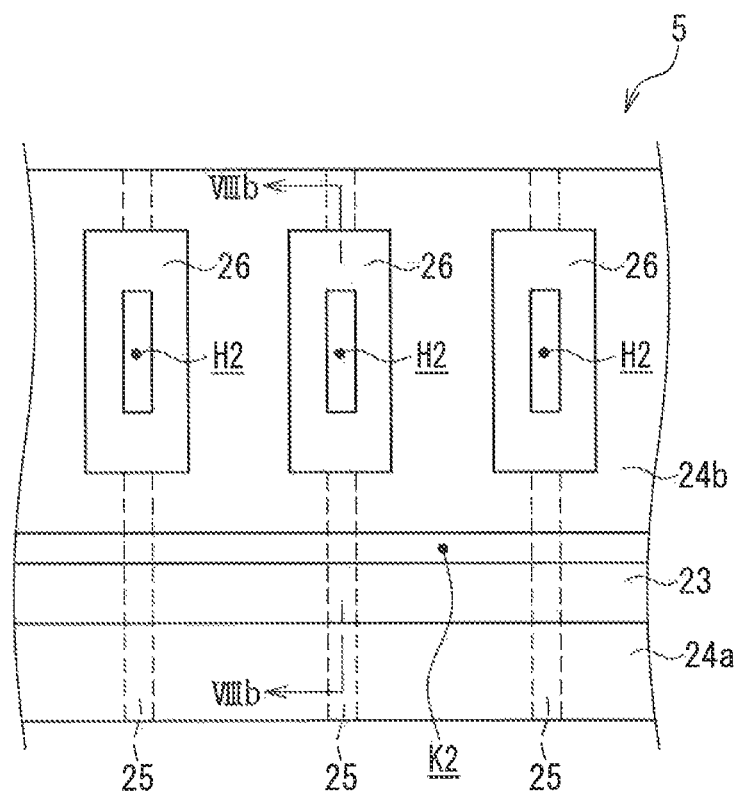
FIG. 8A is a plan view illustrating main portions of an active matrix substrate according to Embodiment 2 of the present invention.
Figure 8B:
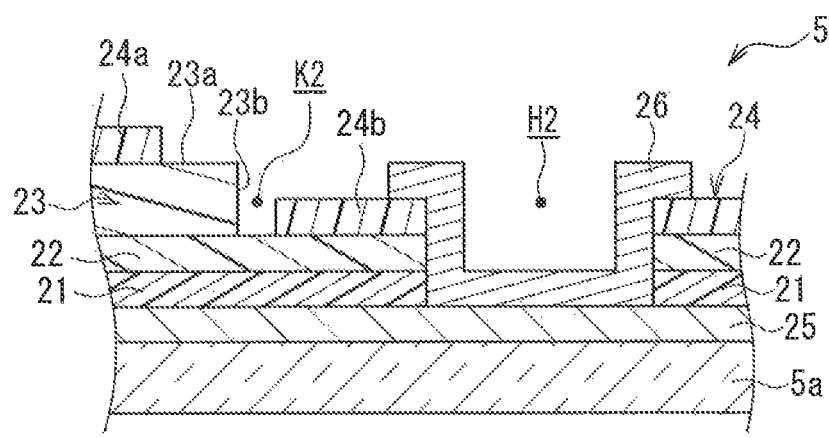
FIG. 8B is a cross-sectional view taken along a line VIIIb-VIIIb in FIG. 8A.

FIG. 8A is a plan view illustrating main portions of an active matrix substrate according to Embodiment 2 of the present invention, and FIG. 8B is a cross-sectional view taken along a line VIIIb-VIIIb in FIG. 8A.

In the drawings, this embodiment mainly differs from the above Embodiment 1 in that a notch is provided in such a manner as to expose an end portion of the organic insulating film (second insulating layer). The same components as those in the above Embodiment 1 are denoted with the same reference numerals, and the explanation will not be repeated.

In FIGS. 8A and 8B, in the active matrix substrate 5 of this embodiment, a notch K2 is provided in such a manner as to expose an end portion of the organic insulating film 23 (part of an upper surface 23*a* and a side surface 23*b*). Specifically, the portion 24*a* of the second inorganic insulating film 24 on the organic insulating film 23 side does not at all contact the first inorganic insulating film 22, which is different from that of Embodiment 1. Further, similarly to the above embodiment, at least part of the notch K2 is provided above the gate insulating film 21 and in a portion of the second inorganic insulating film 24 where the organic insulating film 23 is not present.

With the above configuration, this embodiment can have the effects comparable to those of the above Embodiment 1. Further, in this embodiment, since the notch K2 is provided in such a manner as to expose an end portion of the organic insulating film 23, it is possible to avoid an abnormality in the second inorganic insulating film 24 at an interface with the first inorganic insulating film 22 more reliably.

In addition to the above description, the notch K2 may be configured to expose only the side surface 23*b* of the organic insulating film 23.

Embodiment 3

Figure 9A:
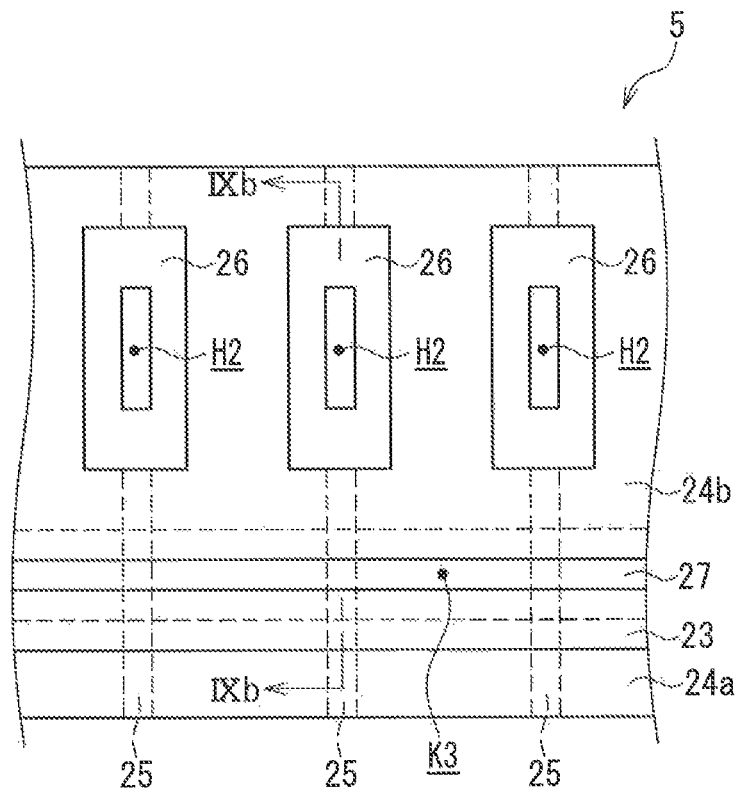
FIG. 9A is a plan view illustrating main portions of an active matrix substrate according to Embodiment 3 of the present invention.
Figure 9B:
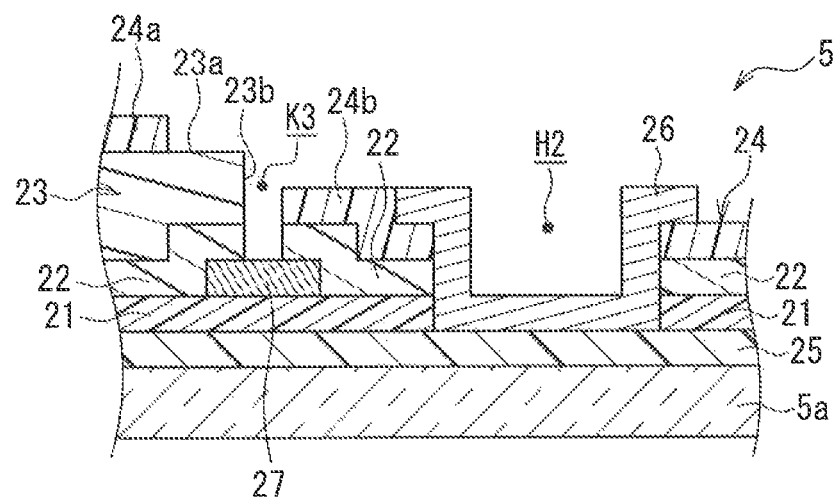
FIG. 9B is a cross-sectional view taken along a line IXb-IXb in FIG. 9A.

FIG. 9A is a plan view illustrating main portions of an active matrix substrate according to Embodiment 3 of the present invention, and FIG. 9B is a cross-sectional view taken along a line IXb-IXb in FIG. 9A.

In the drawings, this embodiment mainly differs from the above Embodiment 2 in that a first conductive layer that is provided at least above the lead wires and exposed through a notch is provided on the gate insulating film. The same components as those in the above Embodiment 2 are denoted with the same reference numerals, and the explanation will not be repeated.

In FIGS. 9A and 9B, in the active matrix substrate 5 of this embodiment, a first conductive layer 27 is provided on the gate insulating film 21 in such a manner as to be exposed through a notch K3. The notch K3 is formed not only in the second inorganic insulating film 24 but also in the first inorganic insulating film 22. In other words, in the active matrix substrate 5 of this embodiment, the first and second inorganic insulating films 22 and 24 are patterned simultaneously, and at the time of formation of the notch K3 by, e.g., a dry etching method, the notch K3 is formed in the first and second inorganic insulating films 22 and 24 simultaneously. Consequently, similarly to the above embodiments, at least part of the notch K3 is provided above the gate insulating film 21 and in a portion of the second inorganic insulating film 24 where the organic insulating film 23 is not present.

At the same time, in the active matrix substrate 5 of this embodiment, for example, the first conductive layer 27 that is made from the same conductive layer as the data bus lines D is provided on the gate insulating film 21 at a position at least above the lead wires 25. Thereby, even when the first and second inorganic insulating films 22 and 24 are patterned simultaneously and the notch K3 is formed, the first conductive layer 27 can protect the gate insulating film 21 and the lead wires 25.

In other words, when the first conductive layer 27 is not provided, and the first and second inorganic insulating films 22 and 24 are patterned simultaneously and the notch K3 is formed by, e.g., a dry etching method, there is a possibility that etching also affects the gate insulating film 21 and further the lead wires 25, which results in corrosion or disconnection of the lead wires 25. Further, there also is a possibility that only the gate insulating film 21 remains as a protection film of the lead wires 25, which decreases protection of the lead wires 25 and consequently results in corrosion or disconnection of the lead wires 25. Moreover, when the first conductive layer 27 is not provided, an etchant that is used for patterning of the connection terminals 26 may erode the lead wires 25.

With the above configuration, this embodiment can have the effects comparable to those of the above Embodiment 2. Further, in this embodiment, the first conductive layer 27 that is provided at least above the lead wires 25 and exposed through the notch K3 is provided on the gate insulating film (insulating film) 21. Thus, in this embodiment, the first conductive layer 27 can protect the lead wires 25, thereby avoiding an abnormality such as disconnection in the lead wires 25 reliably.

Embodiment 4

Figure 10A:
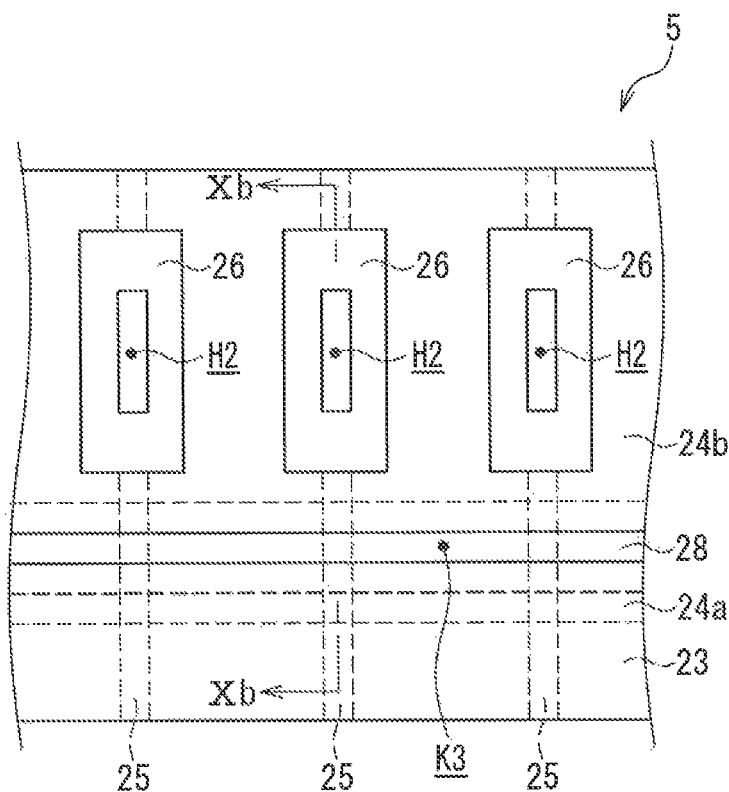
FIG. 10A is a plan view illustrating main portions of an active matrix substrate according to Embodiment 4 of the present invention.
Figure 10B:
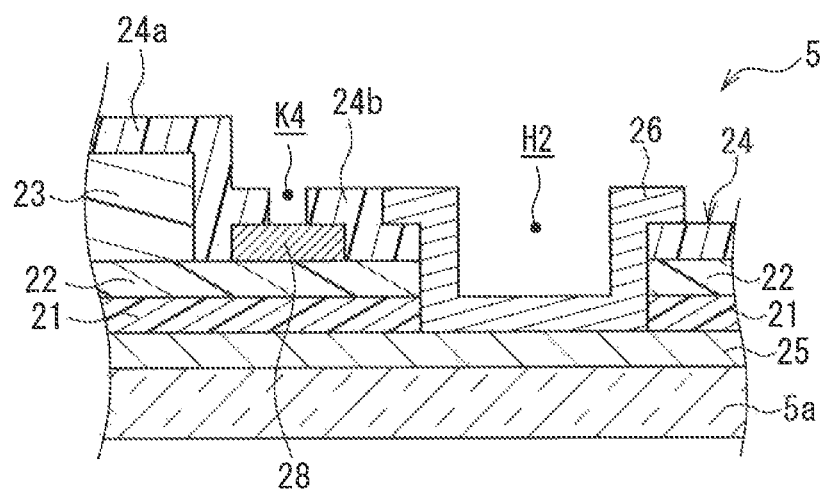
FIG. 10B is a cross-sectional view taken along a line Xb-Xb in FIG. 10A.

FIG. 10A is a plan view illustrating main portions of an active matrix substrate according to Embodiment 4 of the present invention, and FIG. 10B is a cross-sectional view taken along a line Xb-Xb in FIG. 10A.

In the drawings, this embodiment mainly differs from the above Embodiment 1 in that a second conductive layer that is provided at least above the lead wires and exposed through a notch is provided on the first inorganic insulating film (first insulating layer). The same components as those in the above Embodiment 1 are denoted with the same reference numerals, and the explanation will not be repeated.

In FIGS. 10A and 10B, in the active matrix substrate 5 of this embodiment, a second conductive layer 28 is provided on the first inorganic insulating film 22 in such a manner as to be exposed through a notch K4. That is, similarly to the above embodiments, the notch K4 is provided above the gate insulating film 21 and in a portion of the second inorganic insulating film 24 where the organic insulating film 23 is not present.

Further, similarly to the connection terminals 26, the second conductive layer 28 is made of, e.g., a transparent electrode material such as ITO and IZO. The second conductive layer 28 is provided at least above the lead wires 25. Thereby, in the formation of the notch K4, it is possible to avoid etching from affecting the first inorganic insulating film 22, the gate insulating film 21 and further the lead wires 25.

With the above configuration, this embodiment can have the effects comparable to those of the above Embodiment 1. Further, in this embodiment, the second conductive layer 28 that is provided at least above the lead wires 25 and exposed through the notch K4 is provided on the first inorganic insulating film 22. Thus, in this embodiment, the second conductive layer 28 can protect the lead wires 25, thereby avoiding an abnormality such as disconnection and corrosion in the lead wires 25 reliably.

In this embodiment, since the second conductive layer 28 is provided on the first inorganic insulating film 22, the lead wires 25 can be made from the same conductive layer as the data bus lines D.

The above embodiments are all shown for illustrative purposes and are not limiting. The technical range of the present invention is defined by the claims, and all the modifications within the range equivalent to the configuration recited in the claims are also included in the technical range of the present invention.

For example, in the above description, the present invention is applied to a transmission type liquid crystal display device. However, the active matrix substrate of the present invention is limited thereto, and can be applied to any display device that includes a display region having a plurality of pixels, and wires transmitting signals for driving the pixels. For example, the active matrix substrate of the present invention can be applied to an organic EL display, a microcapsule-type electrophoretic display device, and other display devices. The microcapsule-type electrophoretic display device can display an image by, for example, applying voltage to a microcapsule layer formed in a display region on a pixel-by-pixel basis. A display device can include, for example, a substrate provided with wires for a display region that are connected, via switching elements, to pixel electrodes provided in the respective pixels, and draw-out lines that are connected to the wires for the display region. This substrate, for example, can be configured similarly to the active matrix substrates in the above embodiments. Further, the active matrix substrate of the present invention can be applied not only to such a display device, but also to various types of sensor substrates, such as a sensor substrate for an X-ray detection device.

Further, the above description explains the configuration in which the rectangular notch is formed continuously so as to be parallel to one side of the active matrix substrate (i.e., the configuration in which the notch completely separates the second inorganic insulating film (third insulating layer) on the organic insulating film (second insulating layer) side and the second inorganic insulating film (third insulating layer) on the connection terminal side). However, the active matrix substrate of the present invention is not limited thereto, and for example it may have a configuration in which a plurality of notches are provided discontinuously so as to be parallel to one side of the active matrix substrate (i.e., a configuration in which the second inorganic insulating film (third insulating layer) on the organic insulating film (second insulating layer) side and the second inorganic insulating film (third insulating layer) on the connection terminal side are connected partially).

Further, the above description explains the case in which the active matrix substrate of the present invention is applied to a liquid crystal panel of a horizontal alignment mode (a so-called liquid crystal panel of a transverse electric field). However, the active matrix substrate of the present invention is not limited thereto, and can be applied to, e.g., a liquid crystal panel of a vertical alignment mode (a so called liquid crystal panel of a longitudinal electric field) such as a CPA mode.

Specifically, in the liquid crystal panel of a vertical alignment mode, vertical alignment films are provided on the inner surfaces of the active matrix substrate 5 and the counter substrate 4, and a liquid crystal layer composed of, e.g., liquid crystals with negative dielectric anisotropy is used. Further, a common electrode (counter electrode) is provided on the counter substrate 4 side so as to be opposed to pixel electrodes, and the common electrode in the liquid crystal panel of a transverse electric field is used as an auxiliary capacitance electrode to generate an auxiliary capacitance. Further, in the liquid crystal panel of a vertical alignment mode, a longitudinal electric field is generated between the pixel electrodes and the counter electrode (common electrode) (on the counter substrate 4 side), thereby controlling the alignment of liquid crystals. Moreover, in this vertical alignment mode, similarly to the pixel electrodes, the counter electrode as a common electrode is made of a transparent electrode material.

Further, the above description explains the case in which the first insulating layer, the second insulating layer, and the third insulating layer are made of a first inorganic insulating film, an organic insulating film, and a second inorganic insulating film, respectively. However, the active matrix substrate of the present invention is not limited particularly as long as it includes a first insulating layer provided on an insulating film, a second insulating layer provided on the first insulating layer and having a thermal expansion coefficient different from that of the first insulating layer, and a third insulating layer provided in such a manner as to cover the second insulating layer and partially contacting the first insulating layer.

As in the above embodiments, the case is preferred in which the first insulating layer, the second insulating layer, and the third insulating layer are made of a first inorganic insulating film, an organic insulating film, and a second inorganic insulating film, respectively, because appropriate first to third insulating layers can be produced easily. Further, the case is preferred in which the second insulating layer is made of an organic insulating film because the thickness of the second insulating layer can be increased easily and insulation properties of the second insulating layer can be enhanced easily.

Further, the above description explains the case in which the first insulating layer and the third insulating layer are made of the same insulating material. However, the active matrix substrate of the present invention is not limited thereto, and the first insulating layer and the third insulating layer may be made of different insulating materials.

As in the above embodiments, the case is preferred in which the first insulating layer and the third insulating layer are made of the same insulating material because a low-cost active matrix substrate can be configured easily.

Further, the above description explains the configuration in which the gate insulating film is used as the insulating film. However, the active matrix substrate of the present invention is not limited thereto, and the insulating film may be, e.g., a combination of a gate insulating film and another insulating film stacked on the gate insulating film.

Further, the above Embodiment 3 explains the case in which the first conductive layer is made from the same conductive layer as the data bus line. The active matrix substrate of the present invention is not limited thereto, and the first conductive layer may be made from a conductive layer different from that of the data bus line.

As in the above Embodiment 3, the case is preferred in which the first conductive layer is made from the same conductive layer as the data bus line because it is possible to easily configure an active matrix substrate that has a simple structure and thus can be produced by a simplified production process.

Further, the above description explains the configuration in which the data bus lines are provided for the corresponding color pixels (i.e., red (R), green (G), or blue (B)). However, the active matrix substrate of the present invention is not limited thereto, and for example RGB pixels are arranged sequentially with respect to one data bus line.

Further, the above description explains the case in which the thin film transistors are used as switching elements. However, the switching elements of the present invention are not limited thereto, and for example field effect transistors may be used.

In addition to the above description, the above Embodiments 1 to 4 can be combined appropriately.

INDUSTRIAL APPLICABILITY

The present invention is useful with respect to an active matrix substrate that can avoid an abnormality in a third insulating layer at an interface with the first insulating layer due to a difference in thermal expansion coefficient between the first and second insulating layers, and a display device using the same.

| Description of Reference Numerals | |
|---|---|
| 1 | liquid crystal display device (display device) |
| 5 | active matrix substrate |
| 5a | base |
| 21 | gate insulating film (insulating film) |
| 22 | first inorganic insulating film (first insulating layer) |
| 23 | organic insulating film (second insulating layer) |
| 24, 24a, 24b | second inorganic insulating film (third insulting layer) |
| 25 | lead wire |
| 26 | connection terminal |
| 27 | first conductive layer |
| 28 | second conductive layer |
| G, G1-GN | gate bus line |
| D, D1-DM | data bus line |
| K1, K2, K3, K4 | notch |

The invention claimed is:

1. An active matrix substrate, comprising:
   a base;
   a gate bus line provided on the base;
   a data bus line provided in a layer different from that of the gate bus line with an insulating film interposed therebetween;
   a first insulating layer provided on the insulating film;
   a second insulating layer provided on the first insulating layer and having a thermal expansion coefficient different from that of the first insulating layer; and
   a third insulating layer provided in such a manner as to cover the second insulating layer and partially contacting the first insulating layer, wherein
   at least part of a notch is provided above the insulating film and in a portion of the third insulating layer where the second insulating layer is not present, and
   the notch exposes an end portion of the second insulating layer.

2. The active matrix substrate according to claim 1, further comprising:
   a lead wire provided under the insulating film and connected to the gate bus line or the data bus line; and
   a first conductive layer provided on the insulating film at a position at least above the lead wire and exposed through the notch.

3. The active matrix substrate according to claim 2, wherein the first conductive layer is made from the same conductive layer as the data bus line.

4. The active matrix substrate according to claim 1, further comprising a second conductive layer provided on the first insulating layer at a position at least above the lead wire and exposed through the notch.

5. The active matrix substrate according to claim 1, wherein the second insulating layer is made of an organic insulating film.

6. The active matrix substrate according to claim 1, wherein the first insulating layer, the second insulating layer, and the third insulating layer are made of an inorganic insulating film, an organic insulating film, and an inorganic insulating film, respectively.

7. The active matrix substrate according to claim 1, wherein the first insulating layer and the third insulating layer are made of the same insulating material.

8. The active matrix substrate according to claim 1, wherein the notch is provided in the vicinity of a connection terminal that is connected to the gate bus line or the data bus line.

9. A display device using the active matrix substrate according to claim 1.

* * * * *